(12) United States Patent
Kranabenter

(10) Patent No.: US 7,847,627 B2
(45) Date of Patent: Dec. 7, 2010

(54) DEMODULATOR FOR AMPLITUDE-MODULATED SIGNALS

(75) Inventor: Helmut Kranabenter, Graz (AT)

(73) Assignee: NXP B.V., Eindhoven (NL)

( * ) Notice: Subject to any disclaimer, the term of this patent is extended or adjusted under 35 U.S.C. 154(b) by 610 days.

(21) Appl. No.: 11/632,615

(22) PCT Filed: Jul. 7, 2005

(86) PCT No.: PCT/IB2005/052256

§ 371 (c)(1),
(2), (4) Date: Feb. 6, 2008

(87) PCT Pub. No.: WO2006/008685

PCT Pub. Date: Jan. 26, 2006

(65) Prior Publication Data

US 2008/0246541 A1 Oct. 9, 2008

(30) Foreign Application Priority Data

Jul. 13, 2004 (EP) .................................. 04103342

(51) Int. Cl.
H03D 1/00 (2006.01)
(52) U.S. Cl. ........................ 329/347; 329/348; 329/349; 329/350
(58) Field of Classification Search .................. 329/347, 329/348, 349, 350
See application file for complete search history.

(56) References Cited

U.S. PATENT DOCUMENTS 7,579,906 B2 * 8/2009 Kumar et al. ................ 329/364

FOREIGN PATENT DOCUMENTS

EP 1 324 507 7/2003

* cited by examiner

Primary Examiner—Arnold Kinkead

(57) ABSTRACT

A demodulator circuit (DMOD) for amplitude-modulated signals is defined which comprises a threshold switch module (SWS), wherein a signal output (SA) of the threshold switch module (SWS) is connected to the output (DA) of the demodulator circuit (DMOD) and a signal input (SE) of the threshold switch module (SWS) is connected via a first capacitor (C1) to the input (E) of the demodulator circuit (DMOD). In addition, the signal input (SE) can be connected via a coupling element (KO) to a first or alternatively a second.

9 Claims, 6 Drawing Sheets

DEMODULATOR FOR AMPLITUDE-MODULATED SIGNALS

FIELD OF THE INVENTION

The invention relates to a demodulator circuit for amplitude-modulated signals, comprising a threshold switch module, wherein a signal output of the threshold switch module is connected to the output of the demodulator circuit.

BACKGROUND OF THE INVENTION

A demodulator circuit of the type named above is used for the demodulation of an amplitude-modulated signal emitted by a transmitter. One application are for example smart cards, in which a signal sent out by a so-called "reader" is received via a reception coil, and is subsequently evaluated by a demodulator circuit. In the course of this, high coil voltages must be reliably distinguished from low ones, and rising ones from falling ones.

A possibility for effecting this, which is known from the prior art consists in comparing the voltage that is present at the reception coil with a reference voltage, using a comparator. A comparator is essentially an operational amplifier that is operated not in the linear portion of the input/output characteristic, but predominantly in the saturation range, and therefore functions as a threshold switch module. If the coil voltage now exceeds the reference voltage, the comparator switches its output to "high", and if the coil voltage lies below it, it switches to "low". Depending on the wiring, inverting behavior can also be achieved.

Another known possibility is to evaluate the coil voltage not directly, but to evaluate its average value. One way of doing this is to provide a low-pass filter between the comparator and the coil. A further possibility is to evaluate an envelope of the coil voltage, and to provide a peak value rectifier for this. Finally, in place of the comparator one can also use an inverter or a so-called "Schmitt trigger". Here, no external voltage reference is required, since simply the internal switching threshold, or else its envelope, is applied for the comparison with the coil voltage.

Due to various influencing factors, the progression of the coil voltage is not clearly defined: for example, the maximum value depends on the strength of the field emitted by the transmitter. The minimum value in turn depends on how much the transmitter can reduce the field during modulation. In the standard relevant for smart cards, ISO-14443-A, a maximum of 5% of the maximum value is envisaged for that, for example. Other influencing factors are the quality of the transmitting antenna as well as of the reception coil. All the aforementioned influencing factors can lead to the situation where the signal is "blurred"; in other words, during modulation the difference between the maximum and minimum values is reduced, as is the signal rise, and the detection in the demodulator circuit is thus made more difficult.

One thing that all the aforementioned demodulator circuits have in common is the disadvantage that the switching threshold is set at a fixed value, or in the case of the inverter or the Schmitt trigger it depends on the internal wiring of the component, and in addition it is dependent on the temperature and the supply voltage. These circuits are therefore suitable only to a limited degree for evaluating the signal forms mentioned above.

Besides the circuits already mentioned, from the prior art we also know of other design versions for demodulator circuits. For example, U.S. Pat. No. 6,636,146, "Contactless communication system for exchanging data" of 21 Oct. 2003, discloses a demodulator circuit that is particularly suitable for signals with a low modulation depth. Such signals are used for example in order to ensure a power supply to the receiver via the electromagnetic field emitted by the transmitter during the modulation phase too, i.e. when the transmitter reduces its transmitting power. Here, the demodulator circuit comprises a low-pass filter, with which the input signal is filtered. The output signal of the low-pass filter is supplied directly to a first connection of a comparator, and to the others via an RC combination that serves as an integrator and thus makes available the average value of the signal. Here, the comparator preferably has a hysteresis. The document also discloses a further variant of a demodulator circuit, which detects changes in the amplitude. Here, the input signal is once again supplied via a low-pass filter and its output signal is supplied via a differentiator stage to a first input of a comparator. The second input of the comparator is connected to a reference voltage, for example ground. Due to the method of construction, the demodulator circuit is insensitive to the level of the average value of the signal.

Patent US 2003/0128070, "A demodulator for an amplitude-modulated altering signal" of 10 Jul. 2003, furthermore discloses a circuit which comprises a peak value detector as well as two demodulators. One is provided for the purpose of detecting a signal peak and for generating an upper threshold value for recognizing the start of modulation, and a second one is provided for detecting a signal minimum and for generating a lower threshold value for recognizing the end of modulation. For this, the circuit comprises two comparators. A subsequent logic stage then produces the demodulated signal.

Patent US2003/0160650, "Wide dynamic range demodulator for smart cards or contactless tickets" of 28 Aug. 2003, furthermore discloses a demodulator circuit that has a peak value detector for producing the envelope of the input signal and a first module for displacing the received signal by the DC voltage portion of the signal. A further module produces a switching threshold for recognizing the start and end of the modulation. A comparator subsequently compares the two aforementioned signals and makes the demodulated signal available.

Finally, U.S. Pat. No. 5,930,304, "Wireless powered communication device with adaptive data detection and method" of 27 Jul. 1999, discloses a circuit in which a switching threshold of a comparator is altered depending on the strength of the signal received, in order to improve the demodulation.

OBJECT AND SUMMARY OF THE INVENTION

It is an object of the present invention to define a demodulator circuit that enables the demodulation of a received signal even under unfavorable conditions.

To achieve the object stated above, a demodulator circuit of the type mentioned at the outset is defined, in which a signal input of the threshold switch module is connected via a first capacitor to the input of the demodulator circuit, and in which the signal input can be connected via a coupling element to a first or alternatively a second reference voltage, depending on the state of the output of the threshold switch module.

Advantageously, the switch-over points for the rising and falling input signal can be set independently of one another here. The switch-over points are furthermore independent of the absolute value of the input signal, since the switching thresholds are dimensioned relatively from the respective absolute value. This means that the input signal must always fall from an upper resting position by a first differential value, or must rise from a lower resting position by a second differential value, in order to effect a switch-over of the demodulator. The demodulator circuit is therefore insensitive both to different modulation depths and to interfering signals that become unpleasantly apparent in particular during the modulation phase. For this reason, the second differential value is preferably dimensioned such that the amplitude of an interfering signal is smaller than this differential value. A further advantage of the demodulator circuit according to this invention is the avoidance of switching peaks or so-called "bursts". Through the switch-over of the reference voltages, the circuit according to this invention includes a switching hysteresis, through which the aforementioned problem can be avoided. A further advantage is that the delay time between start or end of modulation at the transmitter up until the switching of the demodulator remains largely constant, due to the principle of the relative differential values. To conclude, it is remarked that reference voltages in the sense of the invention do not have to be formed by reference voltage sources, but quite generally represent voltage levels that also include 0 volt or ground.

An advantageous variant of the invention is yielded with a demodulator circuit in which the coupling element comprises a current source arranged between the signal input and the first reference voltage and/or between the signal input and the second reference voltage, or the coupling element comprises a common current source arranged between the signal input and the first and second reference voltages. The coupling element is quite generally there in order to enable a voltage level at the signal input that is different from the first or second reference voltage. This can be realized advantageously by a current source that can be produced comparatively simply in integrated form, i.e. on a chip, in particular when it is switched against ground or the supply voltage. A separate current source is provided respectively for each reference voltage source, or else a common one is provided for both reference voltage sources.

A further advantageous variant is also achieved with a demodulator circuit in which the coupling element comprises an ohmic resistor arranged between the signal input and the first reference voltage and/or between the signal input and the second reference voltage, or the coupling element comprises a common ohmic resistor arranged between the signal input and the first and second reference voltages. Here, the coupling element is realized by an ohmic resistor that can likewise be manufactured in a simple manner. Here too, in each case a separate resistor is provided for a reference voltage source, or one is provided for both reference voltage sources jointly.

It is furthermore beneficial if the coupling element comprises an impedance transformer arranged between the signal input and the first reference voltage and/or between the signal input and the second reference voltage, or the coupling element comprises a common impedance transformer arranged between the signal input and the first and second reference voltages. The coupling element is realized here by an impedance transformer which can be manufactured relatively simply in integrated form. Usually, impedance transformers with a comparatively high output resistance are used for this type of application. Once again, a separate impedance transformer is provided for each reference voltage source, or else a common one is provided for both reference voltage sources.

It is furthermore advantageous if the coupling element comprises an impedance transformer arranged between the signal input and the first reference voltage, and a current source arranged between the signal input and the second reference voltage. In this case, ground can be used for the second reference voltage, and a current source that is connected to ground can be used. The current source here can be realized by a current mirror. In this way, a separate component for producing the second reference voltage can be saved. For the first reference voltage, moreover, a reference voltage already present on the chip can likewise be used. Usually, such sources must not be too heavily loaded, for which reason it is advantageous to decouple them via an impedance transformer. Decoupling can be effected better via an impedance transformer than with a resistor. In addition, the impedance transformer requires less area on a chip than an ohmic resistor.

A further advantageous variant of the invention is also achieved with a demodulator circuit in which the signal input is additionally connected via a second capacitor to a third reference voltage. Usually, a demodulator circuit is operated with relatively low voltages compared with the voltage level that occurs at the reception coil. With the proposed circuit variant it is now possible to adapt the comparatively high voltages at the reception coil to the comparatively low voltage level of the demodulator circuit. In this way, one can do without a separate supply for the demodulator circuit, which for example would require additional chip area on a smart card.

It is furthermore advantageous if a peak value rectifier and/or low-pass filter is connected in series before the first capacitor. Whilst it is possible in principle to use the voltage at the reception coil directly as an input signal for the demodulator circuit, it is better to smooth it beforehand. Possibilities for this are a low-pass filter that forms the average value of the coil voltage, or a peak value rectifier that makes available the envelope of the coil voltage. The peak value rectifier here usually comprises a diode, optionally combined with a current source.

It is also advantageous if a comparator is provided as the threshold switch module, wherein an output of the comparator is provided as the signal output and wherein a first input of the comparator is provided as the signal input and a second input of the comparator is connected to a threshold voltage. On the one hand, comparators are easily available, or can be easily manufactured in integrated form, whilst on the other hand a comparator can be wired externally with a threshold voltage.

Finally, it is also advantageous if an inverter is provided as the threshold switch module, wherein an output of the inverter is provided as the signal output and an input of the inverter is provided as the signal input. An inverter represents a simple component for the actual conversion of a threshold switch module. This is because the inverter requires no external wiring for a threshold voltage, since this is already defined through the internal wiring. One must however take account of the fact that the threshold voltage is not fixed, but is dependent on temperature and supply voltage. It is also conceivable to use an inverter with hysteresis, in other words a so-called "Schmitt trigger".

These and other aspects of the invention are apparent from and will be elucidated, by way of non-limitative examples, with reference to the embodiments described in the figures hereinafter.

DESCRIPTION OF EMBODIMENTS

Figure 1:
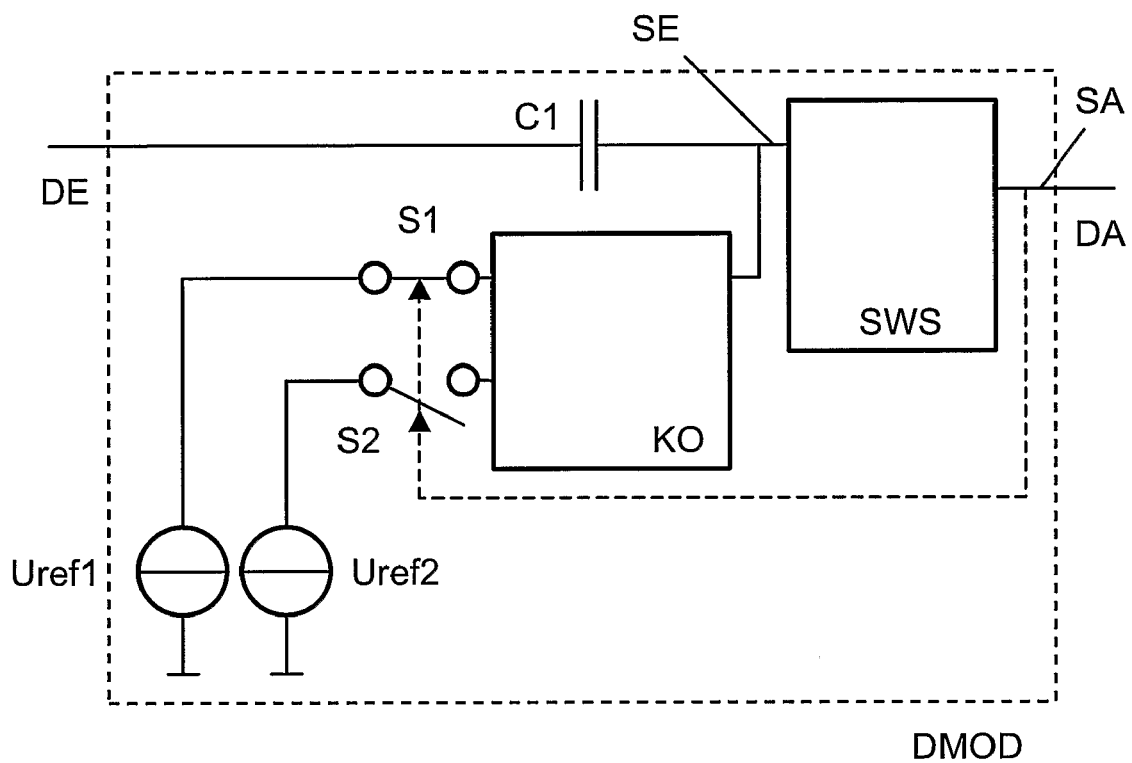
FIG. 1 shows a demodulator circuit in accordance with the invention.

FIG. 1 shows a demodulator circuit DMOD in accordance with the invention, comprising a threshold switch module SWS, a first capacitor C1, a coupling element KO, a first and a second switch S1, S2, as well as a first and a second reference voltage Uref1, Uref2. A signal output SA of the threshold switch module SWS is connected to the output DA of the demodulator circuit DMOD. Furthermore, a signal input SE of the threshold switch module SWS is connected via the first capacitor C1 to the input DE of the demodulator circuit DMOD. Furthermore, the coupling element KO is connected to the signal input SE. The coupling element KO can furthermore be connected via the first switch S1 to the first reference voltage Uref1, or alternatively via the second switch S2 to the second reference voltage Uref2. Which switch is open and which is closed depends on the state of the signal output SA. Here, the first and second reference voltages Uref1 and Uref2 are to be selected such that one reference voltage lies above the threshold value of the threshold switch module SWS and one lies below it.

Figure 2:
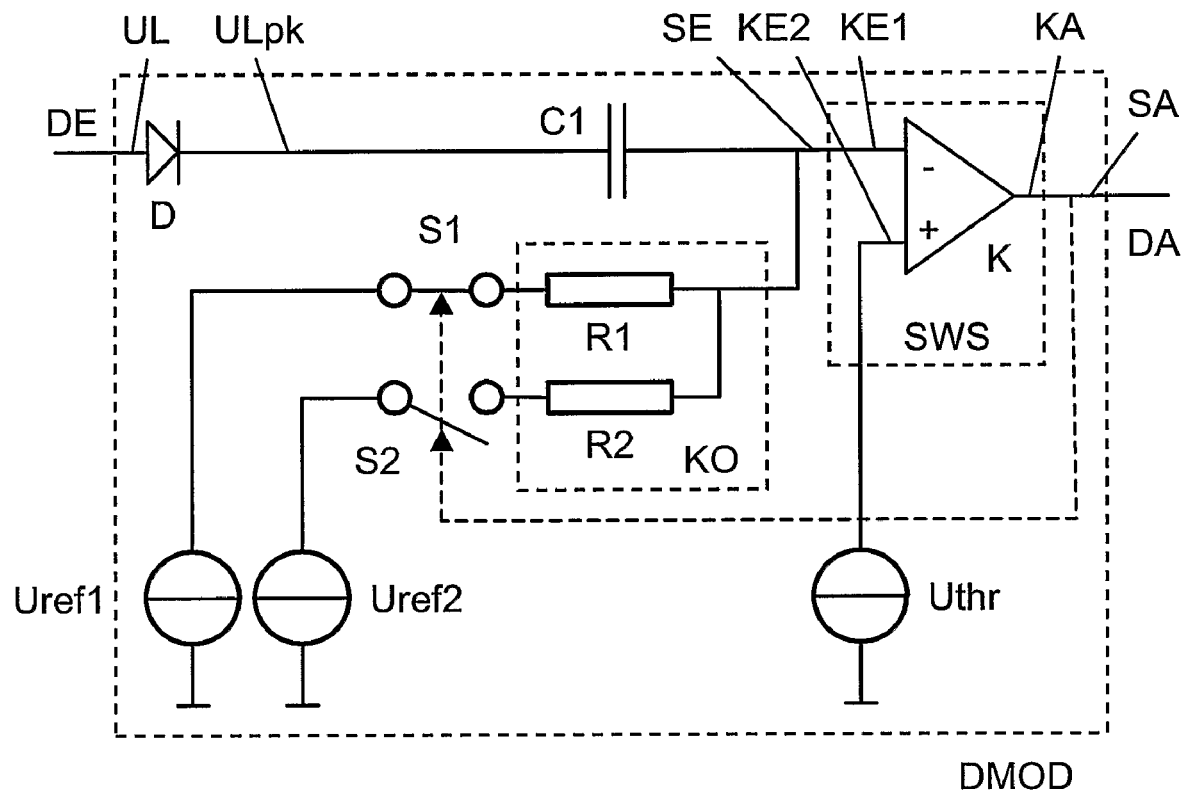
FIG. 2 shows a demodulator circuit according to FIG. 1, in which a comparator is provided as the threshold switch module.
Figure 2A:
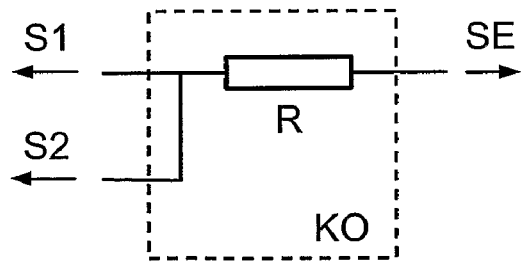
FIG. 2a shows an alternative coupling element for a demodulator circuit according to FIG. 2.

FIG. 2 shows a particular version of the demodulator circuit DMOD according to the invention, according to FIG. 1, in which a comparator K is provided as the threshold switch module SWS, wherein an output KA of the comparator K is provided as the signal output SA, and a first input KE1 of the comparator K is provided as the signal input SE. A second input KE2 of the comparator K is connected to a threshold voltage Uthr. It is pointed out that the threshold voltage Uthr can be variable. However, its changes are slow compared with the changes of the input voltage UL of the demodulator circuit DMOD. A first ohmic resistor R1 which is arranged between the signal input SE and the first reference voltage Uref1, and a second ohmic resistor R2 which is arranged between the signal input SE and the second reference voltage Uref2, are provided as the coupling element KO. Furthermore, inserted between the first capacitor C1 and the input DE of the demodulator circuit DMOD is a diode D which makes available the peak value or the envelope ULpk of the input voltage UL. FIG. 2a shows alternatively a coupling element KO in which a common ohmic resistor R is arranged between the signal input SE and the first and second reference voltages Uref1 and Uref2.

Figure 3:
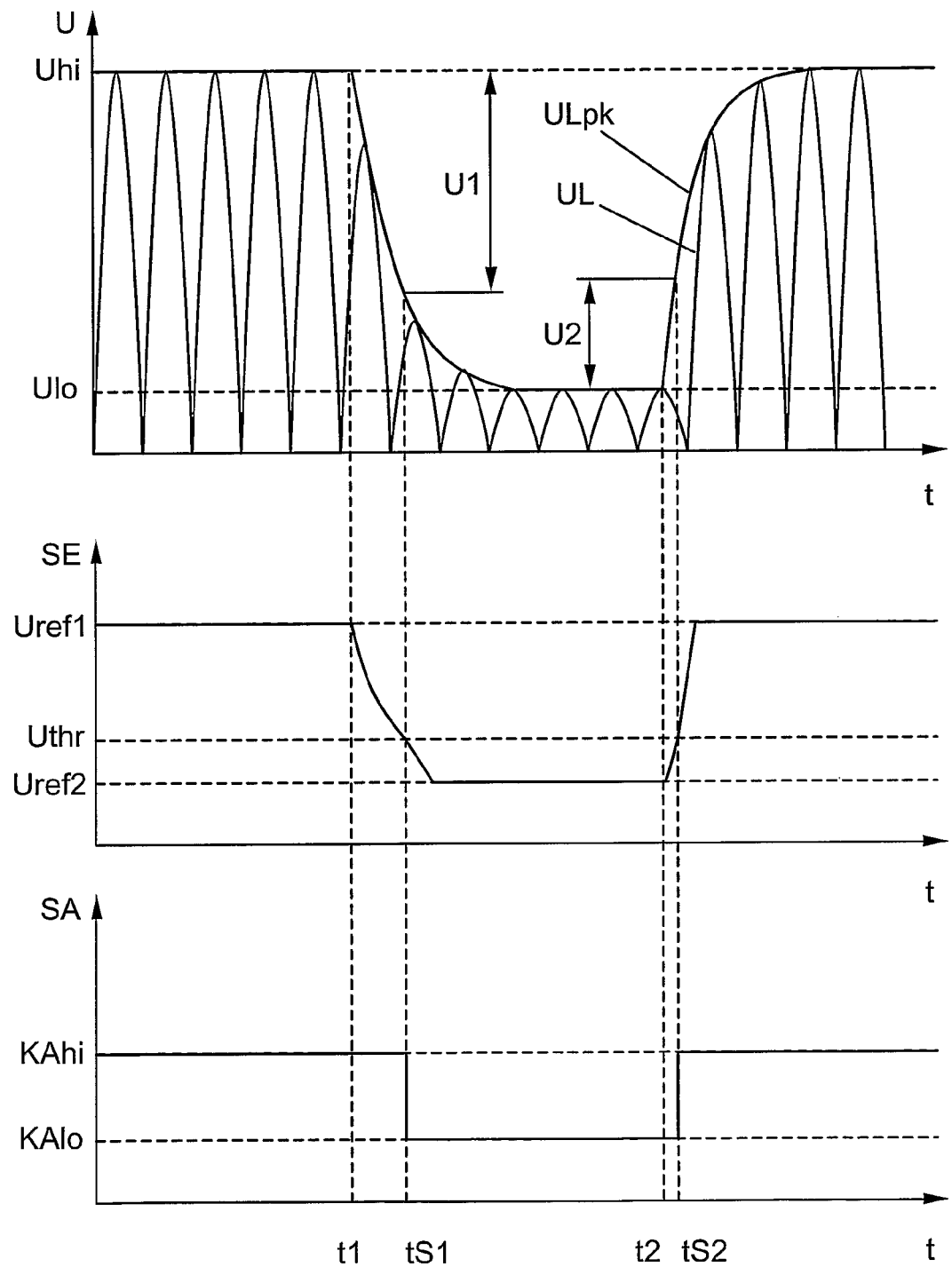
FIG. 3 shows voltage/time curves in the case of a demodulator circuit according to FIG. 2.

The function of the demodulator circuit DMOD shown in FIG. 2 is now explained in greater detail on the basis of FIG. 3. FIG. 3 shows three diagrams with voltage/time curves. The first diagram shows the input voltage UL as well as its envelope ULpk over time t, the second diagram shows the voltage at signal input SE over time t, and the third diagram shows the voltage at signal output SA over time t.

It can be seen from the first diagram that the input voltage UL which corresponds to the rectified reception coil voltage has a high amplitude Uhi up to time t1, then drops to the low amplitude Ulo, and from time t2 onwards rises to the high amplitude Uhi again. Between the time t1 and the time t2, a modulation thus takes place. The envelope ULpk shows the corresponding progression after a peak value rectification with the aid of the diode D.

It is furthermore assumed that the first reference voltage Uref1 is greater than the threshold voltage Uthr, and this in turn is greater than the second reference voltage Uref2. This fact can be clearly seen from the second diagram of FIG. 3. It is now presupposed that the first switch S1 is closed and the second switch S2 is opened as long as no modulation takes place. In the case of a transition from the high amplitude Uhi to the low amplitude Ulo, a falling signal curve of the envelope Ulpk now occurs, for which reason the voltage at the signal input SE of the threshold switch module SWS starting from the first reference voltage Uref1 also drops. As soon as the voltage at the signal input SE drops below the threshold voltage Uthr, which is the case at the first switching time tS1, the voltage at the output KA of the comparator K is switched from a high value KAhi to a low value KAlo. Subsequently, the first switch S1 is opened and the second switch S2 is closed. Since the second reference voltage Uref2 is smaller than the first reference voltage Uref1, the voltage at the signal input SE of the threshold switch module SWS now drops faster until it has the same value as the second reference voltage Uref2.

The reverse procedure then takes place. Starting from the low amplitude Ulo to the high amplitude Uhi, a rising signal progression of the envelope Ulpk now occurs, for which reason the voltage at the signal input SE of the threshold switch module SWS starting from the second reference voltage Uref2 rises. As soon as the voltage at the signal input SE exceeds the threshold voltage Uthr, which is the case at the second switching time tS2, the voltage at the output KA of the comparator K is switched from the low value KAlo to the high value KAhi. Then the first switch S1 is closed and the second switch S2 is opened. Since the first reference voltage Uref1 is greater than the second reference voltage Uref2, the voltage at the signal input SE of the threshold switch module SWS now rises faster until it is as great as the first reference voltage Uref1. The output state is thus achieved once more. It is noted that in the case of the voltage at the signal input SE, overshooting can also occur. The first and the second ohmic resistors R1 and R2 must therefore be selected such that by the end of the modulation or by the start of the next modulation, a stationary state has once more been reached. They cannot therefore be of any random size.

From FIG. 3, it can furthermore easily be seen that the distance between the first reference voltage Uref1 and the threshold voltage Uthr also determines the first differential voltage U1, which indicates how much the input voltage UL starting from the high amplitude Uhi must drop in order to effect a switch-over of the comparator K. Likewise, the distance between the second reference voltage Uref2 and the threshold voltage Uthr determines the second differential voltage U2, which indicates how much the input voltage UL starting from the low amplitude Ulo must rise in order to cause the comparator K to switch over again. Through corresponding choice of the first and second reference voltages Uref1 and Uref2 and of the threshold voltage Uthr, the two switch-over points can be defined independently of one another and independently of the height of the amplitude of the input voltage UL. For this reason, the demodulator circuit DMOD can be adapted particularly well to varying influencing variables such as for example depth of modulation, quality of the transmitter antenna, and quality of the reception coil.

Figure 4:
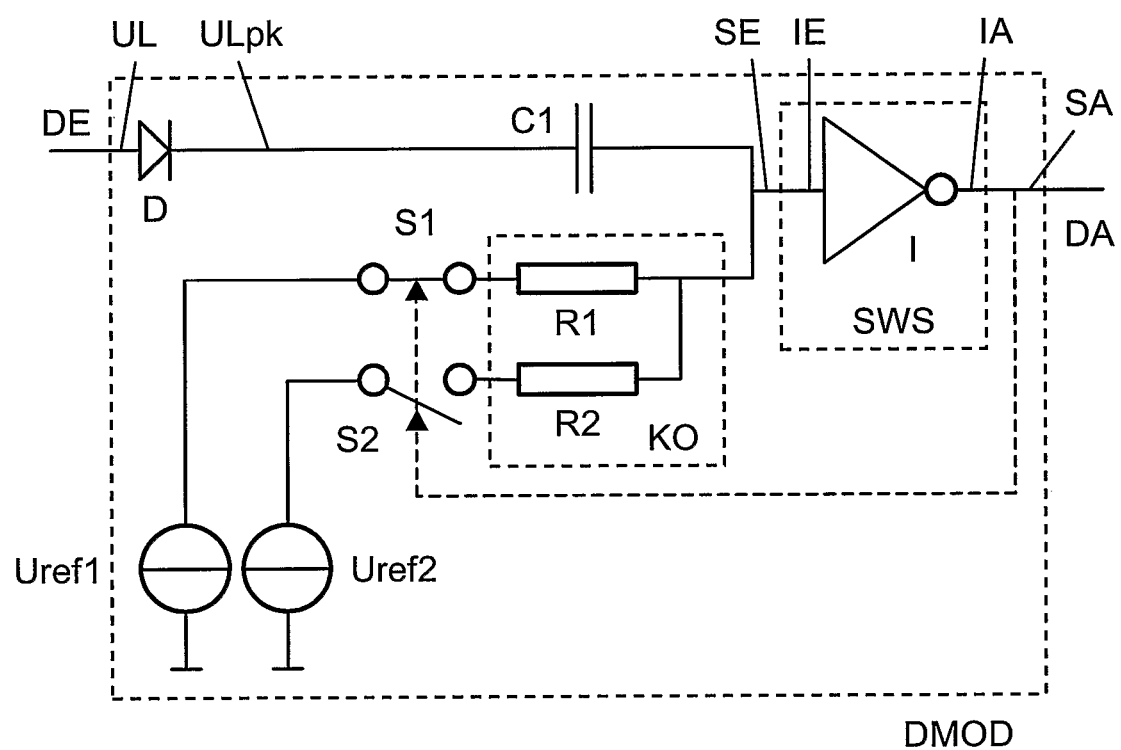
FIG. 4 shows a demodulator circuit according to FIG. 1, in which an inverter is provided as the threshold switch module.

FIG. 4 shows a further particular version of the demodulator circuit DMOD according to the invention, according to FIG. 1, in which an inverter I is provided as the threshold switch module SWS, wherein an output IA of the inverter I is provided as the signal output SA, and an input IE of the inverter I is provided as the signal input SE. In comparison with FIG. 2, the threshold voltage Uthr does not apply here, which in the present case results on account of the internal wiring of the inverter I. Once again, a first ohmic resistor R1 which is arranged between the signal input SE and the first reference voltage Uref1, and a second ohmic resistor R2 which is arranged between the signal input SE and the second reference voltage Uref2, serve as the coupling element KO. Likewise, inserted between the first capacitor C1 and the input DE of the demodulator circuit DMOD is a diode D which makes available the peak value or the envelope ULpk of the input voltage UL.

Figure 5:
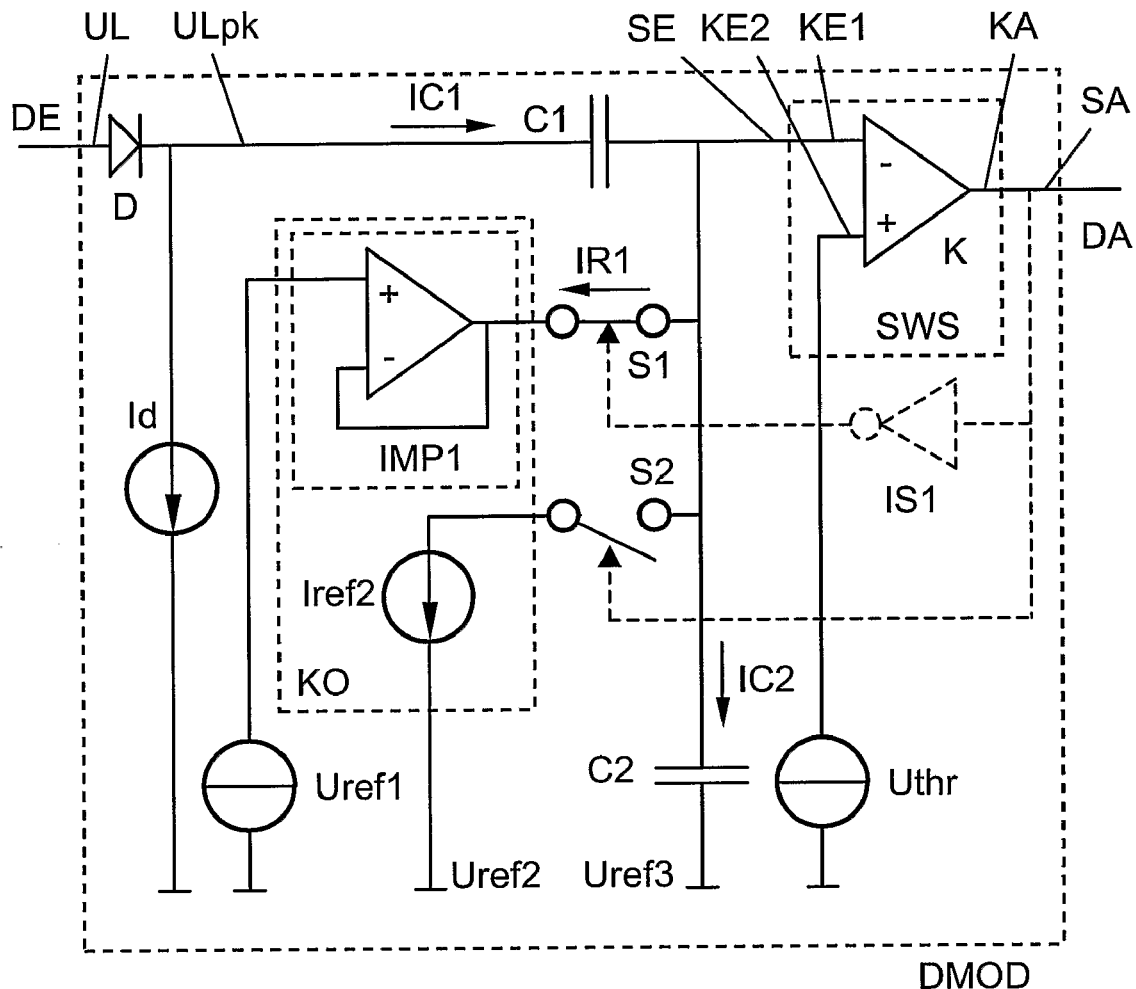
FIG. 5 shows a demodulator circuit according to FIG. 1, which in particular is easy to manufacture in integrated form.

FIG. 5 shows yet another inventive demodulator circuit DMOD according to FIG. 1, in which, as in FIG. 2, a comparator K is provided as the threshold switch module SWS, wherein once again an output KA of the comparator K is provided as the signal output SA, and a first input KE1 of the comparator K is provided as the signal input SE. A second input KE2 of the comparator K is once again connected to a threshold voltage Uthr. Provided as the coupling element KO is an impedance transformer IMP1, which is arranged between the first switch S1 and the first reference voltage Uref1, and a current source Iref2, which is arranged between the second switch S2 and a connection to ground that acts as the second reference voltage Uref2. Analogously to FIG. 2a, a common impedance transformer or a common current source would be conceivable for the coupling element KO. Once again, inserted between the first capacitor C1 and the input DE of the demodulator circuit DMOD there is a diode D, which makes available the peak value or the envelope ULpk of the input voltage UL. The current source Id, which is arranged between the common point of the diode D with the first capacitor C1 and a connection to ground, ensures that the first capacitor C1 is permanently discharged and the envelope ULpk can be correctly reproduced even in the case of sinking amplitude of the input voltage UL. In addition, a second capacitor C2 is also inserted between the signal input SE and a connection to ground that serves as the third reference voltage Uref3. Finally, the alternating triggering of the two switches S1 and S2 is indicated with a switching inverter IS1 between signal output SA and the first switch S1.

In this circuit, it is particularly advantageous that it does not include any ohmic resistors, which when integrated require a relatively large amount of space. In place of the first resistor R1 from FIG. 2, an impedance transformer IMP1 which works in a similar way in functional terms has been inserted, and in place of the second resistor R2 a current source Iref2 has been inserted. For the following dimensioning proposal, the internal resistance of the impedance transformer IMP1 is therefore to be used for the resistor R1. The voltage sources for the first reference voltage Uref1 and for the threshold voltage Uthr are assumed to be ideal and thus without resistance. $U_{SE}$ furthermore indicates the voltage at the signal input SE. The direction of the currents $I_{C1}$, $I_{C2}$, $I_{R1}$ and $I_{Ref2}$ can be found in FIG. 5. On the basis of the Kirchhoff's current law, the following results:

$$I_{C1} = I_{C2} + I_{R1} \quad \text{(S1 closed)}$$

$$I_{C1} = I_{C2} + I_{ref2} \quad \text{(S2 closed)}$$

furthermore:

$$I_{C1} = C_1 \cdot \frac{d(U_{Lpk} - U_{SE})}{dt} \quad \text{(S1 closed)}$$

$$I_{C2} = C_2 \cdot \frac{dU_{SE}}{dt}$$

$$I_{R1} = \frac{U_{SE} - U_{ref1}}{R_1}$$

after substitution, it follows that:

$$\frac{dU_{Lpk}}{dt} = \frac{C_1 + C_2}{C_1} \cdot \frac{dU_{SE}}{dt} + \frac{U_{SE} - U_{ref1}}{C_1 \cdot R_1} \int \frac{dU_{Lpk}}{dt} \cdot dt = \frac{C_1 + C_2}{C_1} \cdot \int \frac{dU_{Lpk}}{dt} \cdot dt + \frac{1}{C_1 \cdot R_1} \cdot \int (U_{SE} - U_{ref1}) \cdot dt \quad \text{(S1 closed)}$$

$$\frac{dU_{Lpk}}{dt} = \frac{C_1 + C_2}{C_1} \cdot \frac{dU_{SE}}{dt} + \frac{I_{ref2}}{C_1} \int \frac{dU_{Lpk}}{dt} \cdot dt = \frac{C_1 + C_2}{C_1} \cdot \int \frac{dU_{SE}}{dt} \cdot dt + \frac{1}{C_1} \cdot \int I_{ref2} \cdot dt \quad \text{(S2 closed)}$$

From this, the four following switching conditions can be derived, which should be ascertained for the function of the demodulator circuit DMOD.

In a state of equilibrium at the switching threshold, the following applies:

$$\frac{dU_{SE}}{dt} = 0$$

$$U_{SE} = U_{thr}$$

and thus:

$$\frac{dU_{Lpk}}{dt} = \frac{U_{thr} - U_{ref1}}{C_1 \cdot R_1} \quad \text{(S1 closed)}$$

$$\frac{dU_{Lpk}}{dt} = \frac{U_{ref2}}{C_1} \quad \text{(S2 closed)}$$

Figure 6:
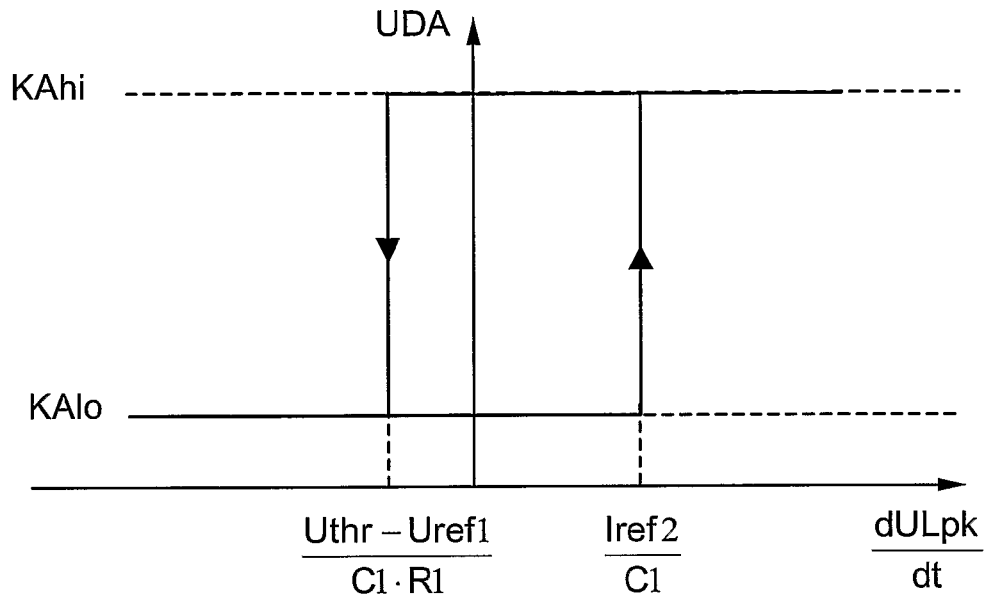
FIG. 6 shows the switching hysteresis in relation to the time-based derivation of the input voltage.

In order to be able to exceed the switching threshold, the first two conditions, visualized in FIG. 6, apply:

$$\frac{dU_{Lpk}}{dt} < \frac{U_{thr} - U_{ref1}}{C_1 \cdot R_1} \quad \text{(S1 closed)}$$

-continued $$\frac{dU_{Lpk}}{dt} > \frac{I_{ref2}}{C_1} \quad \text{(S2 closed)}$$

Furthermore, in the switch-over process between t1 and tS1 or t2 and tS2, the following applies:

$$\int_{t1}^{tS1} \frac{dU_{SE}}{dt} \cdot dt = U_{thr} - U_{ref1} \quad \text{(S1 closed)}$$

$$\int_{t1}^{tS1} \frac{dU_{Lpk}}{dt} \cdot dt = -U_1$$

$$\int_{t2}^{tS2} \frac{dU_{SE}}{dt} \cdot dt = U_{thr} - U_{ref2} \quad \text{(S2 closed)}$$

$$\int_{t2}^{tS2} \frac{dU_{Lpk}}{dt} \cdot dt = U_2$$

Figure 7:
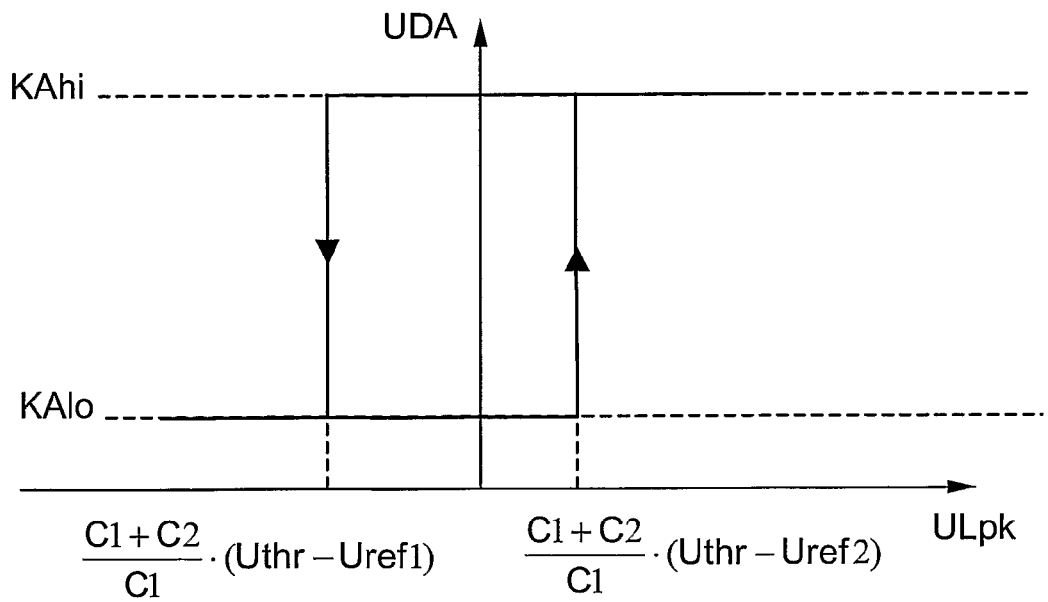
FIG. 7 shows the switching hysteresis in relation to the input voltage.

Under the simplification that the time constants $R_1 \cdot C_1$ or $C_1$ are very large, the further conditions, visualized in FIG. 7, apply:

$$U_1 < \frac{C_1 + C_2}{C_1} \cdot (U_{thr} - U_{ref1}) \quad \text{(S1 closed)}$$

$$U_2 > \frac{C_1 + C_2}{C_1} \cdot (U_{thr} - U_{ref2}) \quad \text{(S2 closed)}$$

Through corresponding choice of the components of the demodulator circuit DMOD, the four switch-over conditions mentioned above can be fulfilled, and thus the function of the demodulator circuit DMOD can be ensured. The use of two alternatively switchable reference voltages Uref1 and Uref2 leads to a hysteresis in the switch-over procedure, both for dULpk/dt as shown in FIG. 6 and for ULpk as shown in FIG. 7. In FIG. 7, it must be noted that the position of the ordinate respectively characterizes the resting value of the envelope ULpk, i.e. depending on the switching procedure, the low amplitude Ulo or the high amplitude Uhi. It is of course also conceivable that the output KA of the comparator K is switched to be inverting. Therefore in FIGS. 3, 6 and 7, in this case the high value KAhi and the low value KAlo would have to be exchanged.

As already mentioned, an advantageous design of the demodulator circuit DMOD is achieved if a relatively large value is chosen for the resistor R1, in this case for the internal resistance of the impedance transformer IMP1, since through this, the fault current at the capacitive voltage divider formed by the first and second capacitors C1 and C2 is only small and therefore the switching thresholds can easily be set. Furthermore, the input signal is not notably damped, since the limit frequency of the high-pass filter that is formed by the first capacitor C1 and the first resistor R1 is relatively small. An analogous approach can of course also be applied for the second resistor R2, or for the internal resistance of the second impedance transformer. Corresponding considerations also apply for the current source Iref2, which likewise should cause only a small fault current at the capacitive voltage divider.

It finally should be noted that the above-mentioned embodiments illustrate rather than limit the invention, and that those skilled in the art will be capable of designing many alternative embodiments without departing from the scope of the invention as defined by the appended claims. In the claims, any reference signs placed in parentheses shall not be construed as limiting the claims. The word "comprising" and "comprises", and the like, does not exclude the presence of elements or steps other than those listed in any claim or the specification as a whole. The singular reference of an element does not exclude the plural reference of such elements and vice-versa. In a device claim enumerating several means, several of these means may be embodied by one and the same item of hardware. The mere fact that certain measures are recited in mutually different dependent claims does not indicate that a combination of these measures cannot be used to advantage.

The invention claimed is:

1. A demodulator circuit for amplitude-modulated signals, comprising a threshold switch module.
   wherein a signal output of the threshold switch module is connected to the output of the demodulator circuit,
   wherein a signal input of the threshold switch module is connected via a first capacitor to the input of the demodulator circuit, characterized in
   that the signal input can be connected via a coupling element to a first or alternatively a second reference voltage depending on the state of the output of the threshold switch module, wherein a voltage at the signal input rises until it is substantially equal to the first reference voltage or drops until it is substantially equal to the second reference voltage, respectively.

2. A demodulator circuit as claimed in claim 1, characterized in that
   the coupling element comprises a current source arranged between the signal input and the first reference voltage and/or between the signal input and the second reference voltage, or that
   the coupling element comprises a common current source arranged between the signal input and the first as well as the second reference voltage.

3. A demodulator circuit as claimed in claim 1, characterized in that
   the coupling element comprises an ohmic resistor arranged between the signal input and the first reference voltage and/or between the signal input and the second reference voltage, or that
   the coupling element comprises a common ohmic resistor arranged between the signal input and the first as well as the second reference voltage.

4. A demodulator circuit as claimed in claim 1, characterized in that
   the coupling element comprises an impedance transformer arranged between the signal input and the first reference voltage and/or between the signal input and the second reference voltage, or that
   the coupling element comprises a common impedance transformer arranged between the signal input and the first and the second reference voltage.

5. A demodulator circuit as claimed in claim 4, characterized in that the coupling element comprises an impedance transformer arranged between the signal input and the first reference voltage, and a current source arranged between the signal input and the second reference voltage.

6. A demodulator circuit as claimed in claim 1, characterized in that the signal input is additionally connected via a second capacitor to a third reference voltage.

7. A demodulator circuit as claimed in claim 1, characterized in that a peak value rectifier and/or a low-pass filter is connected in series before the first capacitor.

8. A demodulator circuit as claimed in claim 1, characterized in that a comparator is provided as the threshold switch module an output of the comparator is provided as the signal output, a first input of the comparator is provided as the signal input and that a second input of the comparator is connected to a threshold voltage.

9. A demodulator circuit as claimed in claim 1, characterized in that an inverter is provided as the threshold switch module, an output of the inverter is provided as the signal output, and an input of the inverter is provided as the signal input.

* * * * *